United States Patent
Levy et al.

(10) Patent No.: US 6,503,321 B2
(45) Date of Patent: *Jan. 7, 2003

(54) SLICING OF SINGLE-CRYSTAL FILMS USING ION IMPLANTATION

(75) Inventors: Miguel Levy, New York; Richard M. Osgood, Jr., Chappaqua; Antonije M. Radojevic, Mamaroneck, all of NY (US)

(73) Assignee: The Trustees of Columbia University in the City of New York, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/289,169

(22) Filed: Apr. 9, 1999

(65) Prior Publication Data

US 2002/0053318 A1 May 9, 2002

Related U.S. Application Data

(63) Continuation-in-part of application No. 09/025,114, filed on Feb. 17, 1998, now Pat. No. 6,120,592.

(51) Int. Cl.[7] ............................................. C30B 25/18
(52) U.S. Cl. ............................ 117/89; 117/94; 117/95; 117/915
(58) Field of Search ........................ 117/915, 89, 94, 117/95

(56) References Cited

U.S. PATENT DOCUMENTS 5,198,371 A * 3/1993 Li ............................... 437/11
5,877,070 A * 3/1999 Goesele et al. ............. 117/915
6,210,597 B1 * 9/2000 Levy et al. ..................... 117/3

OTHER PUBLICATIONS

"Single–Crystal Diamond Plate Liftoff Achieved by ION Implantation and Subsequent Annealing", N.R. Parikh, J.D. Hunn, E. McGucken, M.L. Swanson, C.W. White, R.A. Rudder, D.P. Malta, J.B. Posthill and R.J. Markunas, Appl. Phys. Lett. 61 (26), Dec. 28, 1992.

"Improved Heat Treatment for Wafer Direct Bonding Between Semiconductors and Magnetic Garnets", H. Yokoi, T. Mizumoto, K. Maru and Y. Naito, Jpn. J. Appl. Phys. vol. 36 (1997) pt. 1. No. 5A.

"Fabrication of Single–Crystal Lithium Niobate Films by Crystal Ion Slicing", M. Levy, R.J. Osgood, Jr., R. Liu, L.E. Cross, G.S. Cargill III, A. Kumar and H. Bakhru, ©1998 American Institute of Physics, Applied Physics Letters, vol. 73, No. 16, Oct. 19, 1998.

(List continued on next page.)

Primary Examiner—Robert Kunemund
(74) Attorney, Agent, or Firm—Baker Botts LLP

(57) ABSTRACT

A method is provided for detaching a single-crystal film from an epilayer/substrate or bulk crystal structure. The method includes the steps of implanting ions into the crystal structure to form a damage layer within the crystal structure at an implantation depth below a top surface of the crystal structure, and chemically etching the damage layer to effect detachment the single-crystal film from the crystal structure. The thin film may be detached by subjecting the crystal structure with the ion implanted damage layer to a rapid temperature increase without chemical etching. The method of the present invention is especially useful for detaching single-crystal metal oxide films from metal oxide crystal structures. Methods for enhancing the crystal slicing etch-rate are also disclosed.

24 Claims, 14 Drawing Sheets

OTHER PUBLICATIONS

"Mechanism of Silicon Exfoliation Induced by Hydrogen/Helium Co–Implantation", M.K. Weldon, M. Collot, Y.J. Chabal, V.C. Venezia, A. Agarwal, T.E. Haynes, D.J. Eaglesham, S.B. Christman and E.E. Chaban; Dec. 1998.

"Hydrogen Induced Silicon Surface Layer Cleavage", X. Lu, N.W. Cheung, M.D. Strathman, P.K. Chu, B. Doyle, Appl. Phys. Lett. 71 (13) Sep. 29, 1997, ©1997 American Institute of Physics.

"Basic Mechanisms Involved in the Smart–Cut® Process", B. Aspar, M. Bruel, H. Moriceau, C. Maleville, T. Poumeyrol, A.M. Papon, A. Claverie. G. Benassayag, A.J. Auberton–Hervé, T. Barge, Microelectronic Engineering 36 (1997), 233–240.

Efficient Production of Silicon–on–Insulator Films by Co–Implantation of $He^+$ with $H^+$, A Agarway, T.E. Haynes, V.C. Venezia, O.W. Holland, D.J. Eaglesham, Applied Physics Letters, vol. 72, No. 9, Mar. 2, 1998.

"High–Dose Helium–Implanted Single–Crystal Silicon: Annealing Behavior", R. Tonini, F. Corni, S. Frabboni, G. Ottaviani, G.F. Cerofolini, Journal of Applied Physics, vol. 84, No. 9, Nov. 1, 1998.

"Layer Splitting Process in Hydrogen–Implanted Si, Ge, SiC, and Diamond Substrates", Q.Y. Tong, K. Gurjahr, S. Hopfe, U. Gösele, T.H. Lee, Applied Physics Letter 70 (11) Mar. 17, 1997, ©1997 American Institute of Physics.

"Silicon on Insulator Material Technology", M. Bruel, Electronics Letters, Jul. 6, 1995, vol. 34, No. 14.

"The History, Physics, and Applications of the Smart–Cut® Process", M. Bruel, MRS Bulletin, Dec. 1998.

* cited by examiner

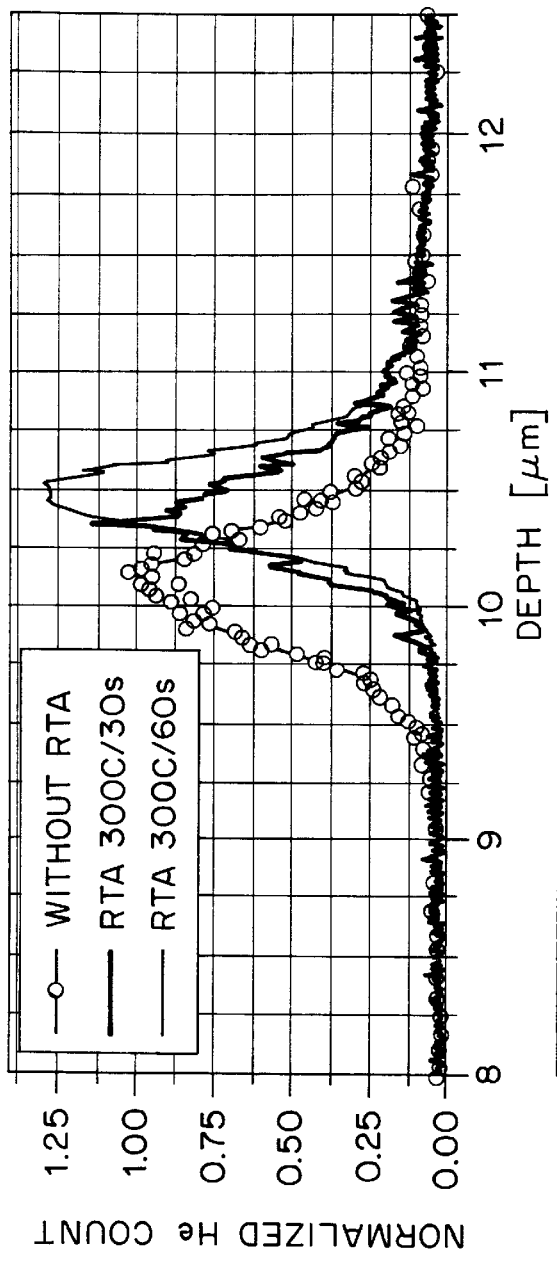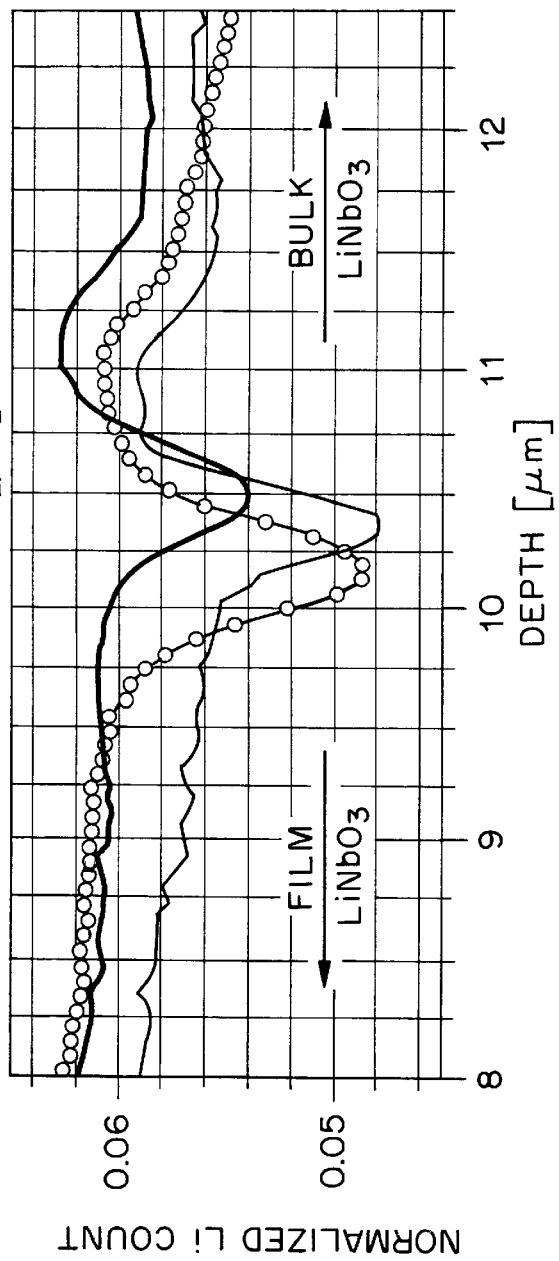

SLICING OF SINGLE-CRYSTAL FILMS USING ION IMPLANTATION

This application is a continuation in part of U.S. Application Ser. No. 09/025,114 filed Feb. 17, 1998, now U.S. Pat. No. 6,120,592, which is incorporated as reference.

STATEMENT REGARDING FEDERALLY SPONSORED RESEARCH

The invention described herein was funded in part by a grant from AFOSR/DARPA Program, Contract No. F49620-99-1-0038, and in part by DARPA FAME Program, Contract No. N0017398-1-G014. The United States Government may have certain rights under the invention.

FIELD OF THE INVENTION

This invention is related in general to the field of manufacturing heterogeneous integrated circuit devices utilizing bonded single-crystal films. More particularly, the invention is related to a method for detaching thin single-crystal films from crystal for bonding onto growth-incompatible substrates.

BACKGROUND OF THE INVENTION

Epitaxial liftoff techniques have been used since 1987 for achieving heterogeneous integration of many III-V and elemental semiconductor integrated circuits. For example, epitaxial liftoff has been shown to be effective for integrating hetero-junction bipolar transistors (HBT's) and diode lasers on silicon, gallium arsenide and other common substrates. Despite this success, however, it has been impossible to integrate devices comprised of other important materials, namely non-semiconductor materials such as metal oxides, on these common substrates.

A need for integrated circuit devices combining non-semiconductor materials with conventional substrates has arisen in the field of electro-optic and magneto-optic devices. For example, a need has arisen for on-chip integrated magneto-optical devices, such as optical isolators, for use in fiber-optic telecommunications networks. Although commercially available isolators use bulk bismuth-substituted yttrium iron garnet (Bi—YIG), and other conventional integrated isolators require epitaxial growth on gadolinium gallium garnet (GGG), conventional epitaxial growth technologies are subject to the limitations of high temperature chemistry, complex stoichiometry and lattice matching.

More importantly, conventional methods are ineffective for growing single crystal-structures that exhibit good optical and magnetic properties for combination with semiconductor materials. Efforts using sputter growth technology, for example, have been unsuccessful in yielding single-crystal films with acceptable optical and magnetic properties.

Another need for integrated circuit devices combining non-semiconductor materials with conventional substrates has arisen in the field of microwave communications. For example, the need has arisen for frequency agile resonators requiring integrated circuit devices. Conventional frequency agile resonators, made of poly-crystalline materials such as ferroelectric solids, are undesirable because of their limited bandwidth and high loss tangents. Instead, it is desirable to construct frequency agile resonators and other integrated microwave circuits which are made of ferroelectric or magneto-optic single-crystal films.

Furthermore, conventional epitaxial liftoff techniques as developed for III–V semiconductors make use of the large differential etch rates between a buried sacrificial layer and the epitaxial structure of interest to detach the latter from its growth substrate. For example, early epitaxial liftoff techniques were based on the high wet etch selectivity of an aluminum arsenide (AlAs) layer over an aluminum gallium arsenide ($Al_xGa_{1-x}As$) layer. Subsequent work has demonstrated the liftoff of epitaxially grown layers in other III–V materials, all based on selective etching of sacrificial epitaxial layers. In addition, conventional ion-implantation-based epitaxial liftoff techniques, albeit using different separation mechanisms, have been reported in high-dose-high-energy O-implanted diamond and $H^+$-implanted Si. See "Single-Crystal Diamond Plate Liftoff Achieved by Ion Implantation and Subsequent Annealing," N. R. Parikh, J. D. Hunn, E. McGucken, M. L. Swanson, C. W. White, R. A. Ruder, D. P. Malta, J. B. Posthill and R. J. Markunas, *Appl. Phys. Lett.* 61 (26), Dec. 28, 1992; M. Bruel, *Electron. Lett.*, vol. 31 at 1201 (1995). Conventional bonding techniques for epitaxially grown layers have included the use of adhesives and van der Waals forces on bare substrates.

SUMMARY OF THE INVENTION

Therefore, it is an object of the present invention to provide a method for detaching thin single-crystal films from crystal, such as epilayer/substrate or bulk single-crystal material, for bonding onto growth-incompatible substrates.

It is another object of the present invention to provide a method for detaching thin single-crystal films made of magnetic garnet materials from growth-compatible substrates for use in integrated photonics and microwave circuits.

It is still another object of the present invention to provide a method for detaching thin single-crystal films made of ferroelectric materials from growth-compatible substrates or bulk crystal for use in integrated photonics and microwave circuits.

It is yet another object of the present invention to provide a method for detaching thin single-crystal films from growth-compatible substrates without using conventional etching techniques.

It is a further object of the present invention to provide a method for enhancing the etch selectivity and detachment of thin single-crystal films from bulk crystal.

Hence, crystal ion-slicing methods are hereinafter described that substantially overcome the aforedescribed limitations and inadequacies of conventional epitaxial liftoff methods. In a preferred method of the present invention, for example, a method is provided for detaching a single-crystal film from crystal. The crystal, for example, can be an epilayer/substrate crystal or a bulk crystal. The method includes the steps of implanting ions into the crystal structure to form a damage layer within the crystal structure at an implantation depth below a planar top surface of the crystal structure, and then chemically etching the damage layer to effect detachment of the single-crystal film from the crystal structure. The preferred method of the present invention is especially useful for detaching single-crystal metal oxide films from metal oxide crystal structures.

In accordance with another preferred method of the present invention, a method is provided for detaching a single-crystal film from a crystal structure, the method including the steps of implanting ions into the crystal structure to form a damage layer within the crystal structure at an implantation depth below a planar top surface of the crystal structure, and then subjecting the crystal structure with the damage layer to a rapid temperature increase to effect detachment of the single-crystal film from the growth-compatible substrate without chemical etching.

In accordance with yet another preferred method of the present invention, a method is provided for detaching a single-crystal film from a crystal structure, the method including the steps of implanting ions into the crystal structure to form a damage layer within the crystal structure at an implantation depth below a planar surface of the crystal structure, bonding the crystal structure to a second substrate, and subjecting the crystal structure with the damage layer to a rapid temperature increase to effect detachment of the single-crystal film from the crystal structure without chemical etching.

Further, a method for enhancing the detachment of a single-crystal film from a bulk crystal structure is provided, the method including the steps of: implanting ions into the bulk crystal structure to form a damage layer at an implantation depth below a planar top surface of the bulk crystal structure; rapid thermal annealing the ion-implanted bulk crystal structure; and chemically etching the damage layer within the annealed bulk crystal structure to effect detachment of the single-crystal film from the bulk crystal structure.

Still further, a method is provided for enhancing the etch selectivity as between a bulk crystal structure and an ion implantation damaged layer formed in the bulk crystal structure, the method including the steps of implanting ions into the bulk crystal structure to form a damage layer at an implantation depth below a planar top surface of the bulk crystal structure; and rapidly thermal annealing the ion-implanted bulk crystal structure.

Yet further, a method is provided for enhancing the detachment of a single-crystal film from a ferroelectric bulk crystal structure, the method including the steps of: implanting ions into the bulk crystal structure to form a damage layer at an implantation depth below a planar top surface of the bulk crystal structure; rapid thermal annealing the ion-implanted bulk crystal structure; and chemically etching the damage layer within the annealed bulk crystal structure to effect detachment of the single-crystal film from the bulk crystal structure Further objects, features and advantages of the invention will become apparent from the following detailed description taken in conjunction with the accompanying figures showing illustrative embodiments of the invention.

BRIEF DESCRIPTION OF THE DRAWINGS

For a complete understanding of the present invention and the advantages thereof, reference is now made to the following description taken in conjunction with the accompanying drawings in which like reference numbers indicate like features and wherein:

FIGS. 21A and 21B show $He^+$ and Li area-normalized SIMS data, respectively, with and without rapid thermal annealing in 3.8 MeV $He^+$ implanted $LiNbO_3$ for an SHG bulk crystal.

DETAILED DESCRIPTION OF THE INVENTION

Figure 1A:
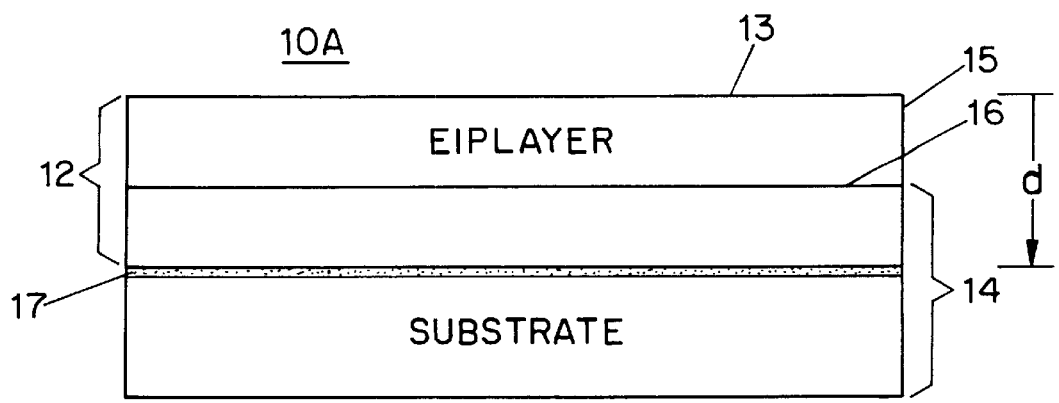
FIGS. 1A and 1B are side views showing an epilayer/substrate crystal structure and bulk crystal structure, respectively, for providing a single-crystal film according to the preferred crystal ion-slicing methods of the present invention.
Figure 1B:
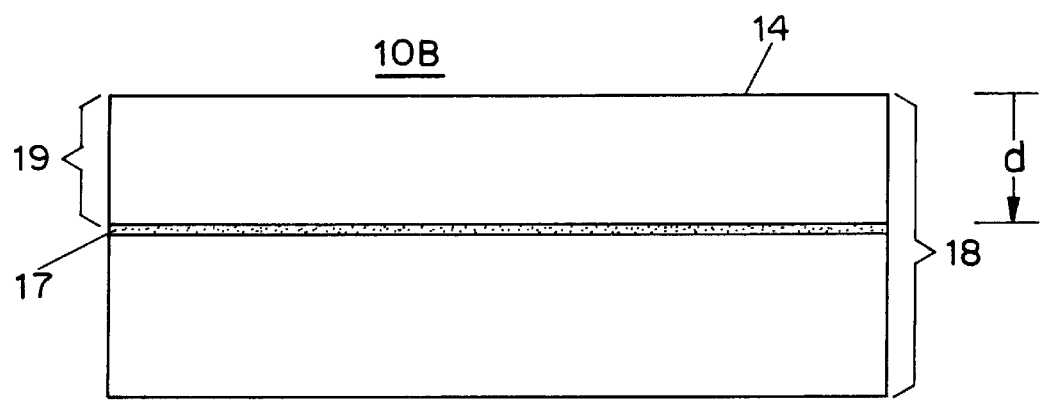

FIGS. 1A and 1B show crystal structures for providing single-crystal films 12 and 19 according to the preferred crystal ion-slicing methods of the present invention. Both FIGS. 1A and 1B show portions 15 and 18, respectively, for forming the single-crystal films 12 and 19, respectively. Advantageously, the crystal structures of FIGS. 1A and 1B can be metal oxide crystal structures having metal oxide portions 15 and 18 for forming single-crystal metal oxide films.

FIG. 1A shows an epilayer/substrate crystal structure 10A having a substrate 14, an epilayer 15 grown on a top surface of the substrate 14, an epilayer/substrate interface 16, and a damage layer 17 formed in the substrate 14 a depth d below the planar top surface 13 of the epilayer/substrate crystal structure 10A. Although the damage layer 17 of FIG. 1A is shown to be below the epilayer/substrate interface 16, alternatively the damage layer 17 can be formed within the epilayer 15 as required. The damage layer 17 is formed by ion implantation as will be explained in detail hereinbelow.

The epilayer 15 of FIG. 1A can be a metal oxide epilayer used for forming a single-crystal metal oxide film. As such, the epilayer 15 can be a layer of magnetic garnet material, preferably yttrium iron garnet (YIG), bismuth-substituted yttrium iron garnet (Bi—YIG) or other garnet materials, formed on the top surface 16 of a gadolinium gallium garnet (GGG) or other growth-compatible substrate. The metal oxide epilayer 15 can also be a layer of ferroelectric material, such as lithium niobate ($LiNbO_3$) or strontium titanate ($SrTiO_3$), formed on the top surface 16 of a growth compatible substrate. Alternatively, the epilayer/substrate crystal structure 10A may include a plurality of the metal oxide epilayers grown on the substrate.

FIG. 1B shows a bulk crystal structure 10B for forming a single-crystal film 19. The bulk crystal structure 10B also includes a damage layer 17 formed therein at a depth d below the planar top surface 14 of the bulk crystal structure 10B. Advantageously, the bulk crystal structure 10B can be a metal oxide structure used for forming a single-crystal metal oxide film. As further shown in FIG. 5, the bulk crystal structure 10B of FIG. 1B is the preferred crystal structure for forming $LiNbO_3$ single-crystal films according to the preferred crystal ion-slicing methods of the present invention.

Figure 2:
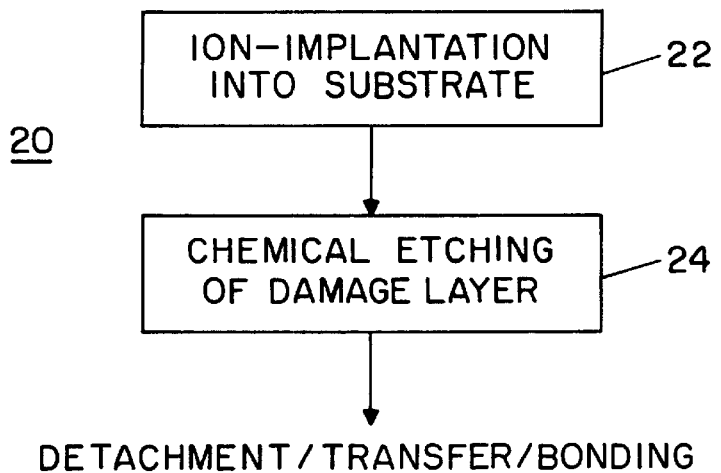
FIG. 2 is a flow diagram showing the steps of a preferred method for crystal ion-slicing of single-crystal films.

FIG. 2 shows a preferred method 20 for crystal ion-slicing a single-crystal film from a crystal structure. The method includes the steps of implanting ions into a crystal structure to form a damage layer within the substrate (Step 22) and chemical etching the damage, or "sacrificial," layer from the substrate (Step 24). Preferably, the chemical etching step is liquid chemical etching. The single-crystal film is thereby detached from the substrate for transfer and bonding onto a growth-incompatible structure such as silicon or gallium arsenide.

Figure 3:
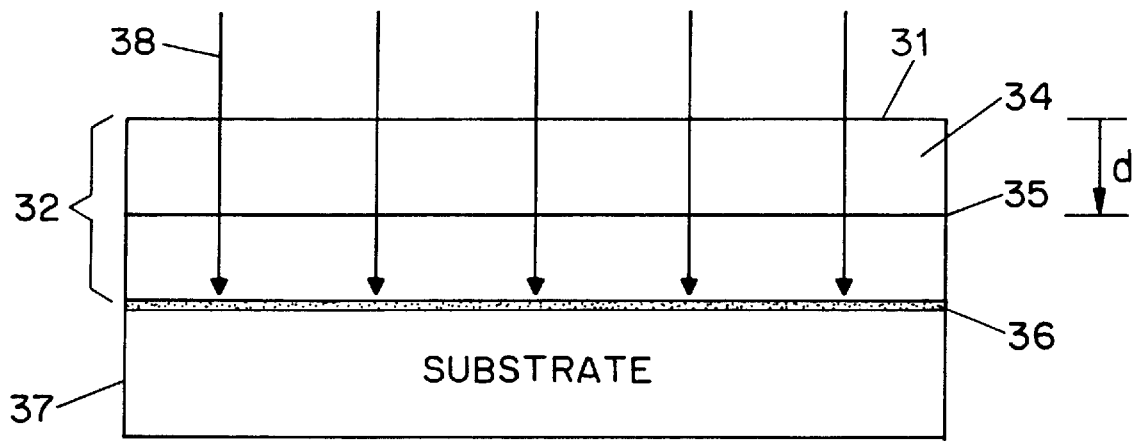
FIG. 3 is a side view diagram showing an ion implantation step according to the crystal ion-slicing method of FIG. 2.

FIG. 3 shows an ion implantation step according to the crystal ion-slicing method of FIG. 2. Although shown with respect to an epilayer/substrate crystal structure, the ion implantation step of FIG. 3 is also applicable for detaching single-crystal films from bulk crystal structures.

As shown in FIG. 3, elemental ions 38 such as energetic helium or hydrogen ions, for example, are implanted at a predetermined energy into an epilayer/substrate crystal structure 30 having a substrate 37, an epilayer 34 formed on the substrate 37, and an epilayer/substrate interface 35. The ions can also be chemically reactive ions, such as hydrogen or boron, that react with the crystal lattice after implantation.

The ions are implanted through the epilayer 34 such that a damage layer 36 is formed at a depth d below the planar top surface 31 of the epilayer/substrate crystal structure 30. Alternatively, the damage layer 36 can be formed within the epilayer 34.

The ion implantation step introduces lattice defects into the crystal structure 30 in forming the damage layer 36. The lattice defects are introduced by the transfer of energy to the target nuclei in the crystal lattice, and are formed near the end of the ionic trajectories. Depending upon the selected implantation species and the kinetic energy of the ions, the lattice defects and thus the damage layer 36 are introduced into the substrate 37 at a depth d below the surface of the crystal structure 30.

Referring again to FIG. 3, the thickness of the single-crystal film 32 is therefore determined by the kinetic energy of the implanted ions 38, which can be varied accordingly to yield the desired film thickness. The damage layer, or "sacrificial" layer, enables the single-crystal film 32 to be "sliced-off" the top of the crystal structure 30 for transfer and bonding onto a growth-incompatible substrate.

Figure 4:
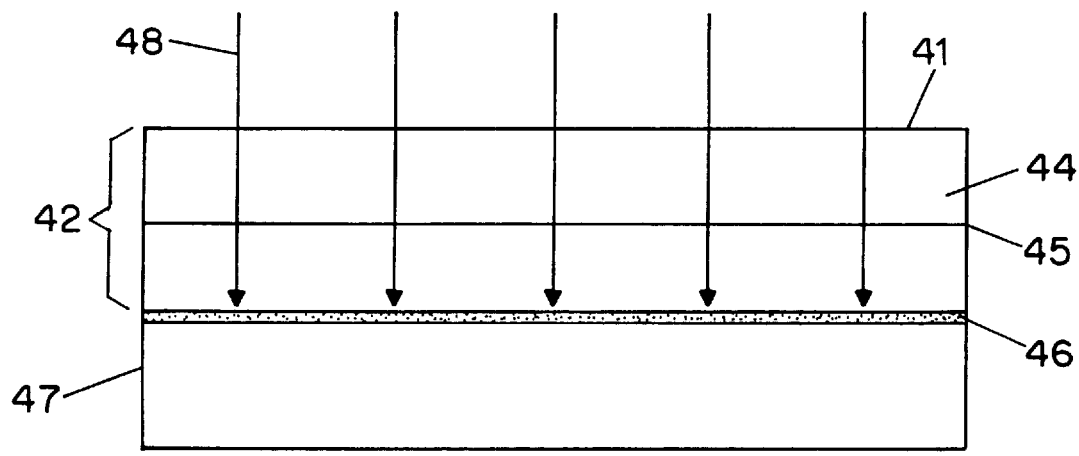
FIG. 4 is a side view diagram showing an ion implantation step according to the crystal ion-slicing method of FIG. 2 whereby an epilayer/substrate crystal structure is used for forming a YIG or Bi—YIG single-crystal film.

FIG. 4 shows a preferred method of FIG. 2 wherein singly-ionized 3.8 MeV helium ions 48, for example, are implanted normal to the planar top surface 41 of an epilayer/substrate crystal structure 40 to form a damage layer 46 within the crystal structure 40. The crystal structure 40 includes a YIG, Bi—YIG or other garnet epilayer 42, a GGG or other growth-compatible substrate 47, and an epilayer/substrate interface 45. During implantation, the implantation dose for the singly-charged 3.8 MeV helium ions is nominally on the order of $5 \times 10^{16}$ ions/cm$^2$. The samples are mounted on a specially designed, two-inch diameter water-cooled target holder (not shown) to ensure that the temperature of the substrate is below 400° C.

As an added precaution, the beam current during ion implantation is kept low, e.g., less than 0.25 $\mu A/cm^2$. This precaution is necessary to avoid modifying the optical absorptivity and magnetic anisotropy of the sample during ion implantation. The uniformity of the implantation is checked by four Faraday cups (not shown) outside the target holder.

Figure 5:
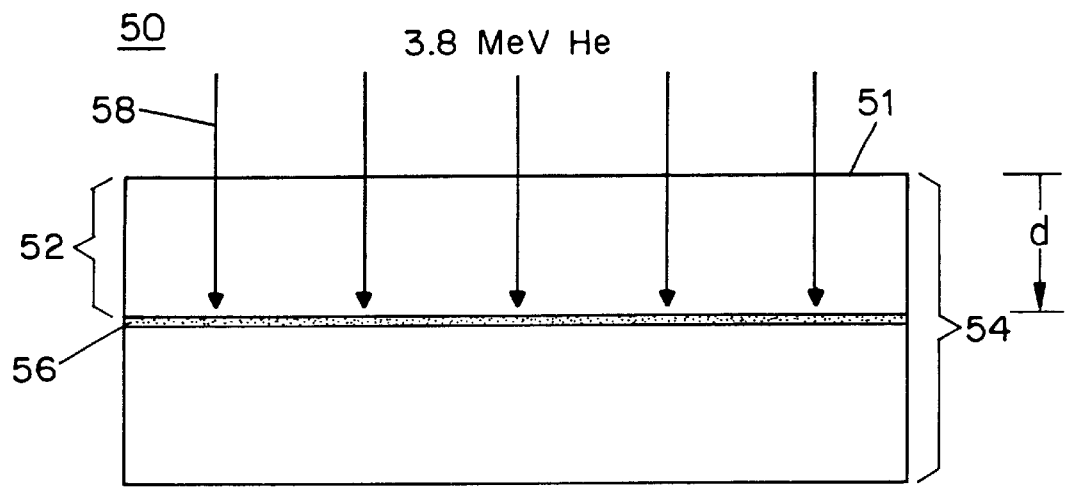
FIG. 5 is a side view diagram showing an ion implantation step according to the crystal ion-slicing method of FIG. 2 whereby a bulk crystal structure is used for forming a $LiNbO_3$ single-crystal film.

Similarly, as shown in FIG. 5, singly-ionized 3.8 MeV helium ions 58 can be implanted normal to the planar surface 51 of a bulk crystal structure 50 to form a damage layer 56 within the crystal structure 40. The bulk crystal structure 50 may be comprised of a magnetic garnet or ferromagnetic material.

In the preferred method as shown in FIGS. 2 through 5, a low atomic weight implantation species, preferably helium, is advantageously chosen to yield a deeply buried damage layer. In addition, helium is desirable because of the resulting implantation profile and the distribution of lattice damage in the crystal, which in turn is determined by the energy loss per unit trajectory length, or "stopping power." At high ionic energies, the "stopping power" is dominated by electronic scattering and is characterized by the Lindhard-Scharff-Schiott (LSS) theory. The LSS theory predicts a stopping power proportional to $\sqrt{E}$, where E is the kinetic energy of the implanted ion along its trajectory for high energy ions. At low energies, the "stopping power" is inversely proportional to $E^2$ and is primarily characterized by Rutherford scattering with the host nuclei.

Figure 6:
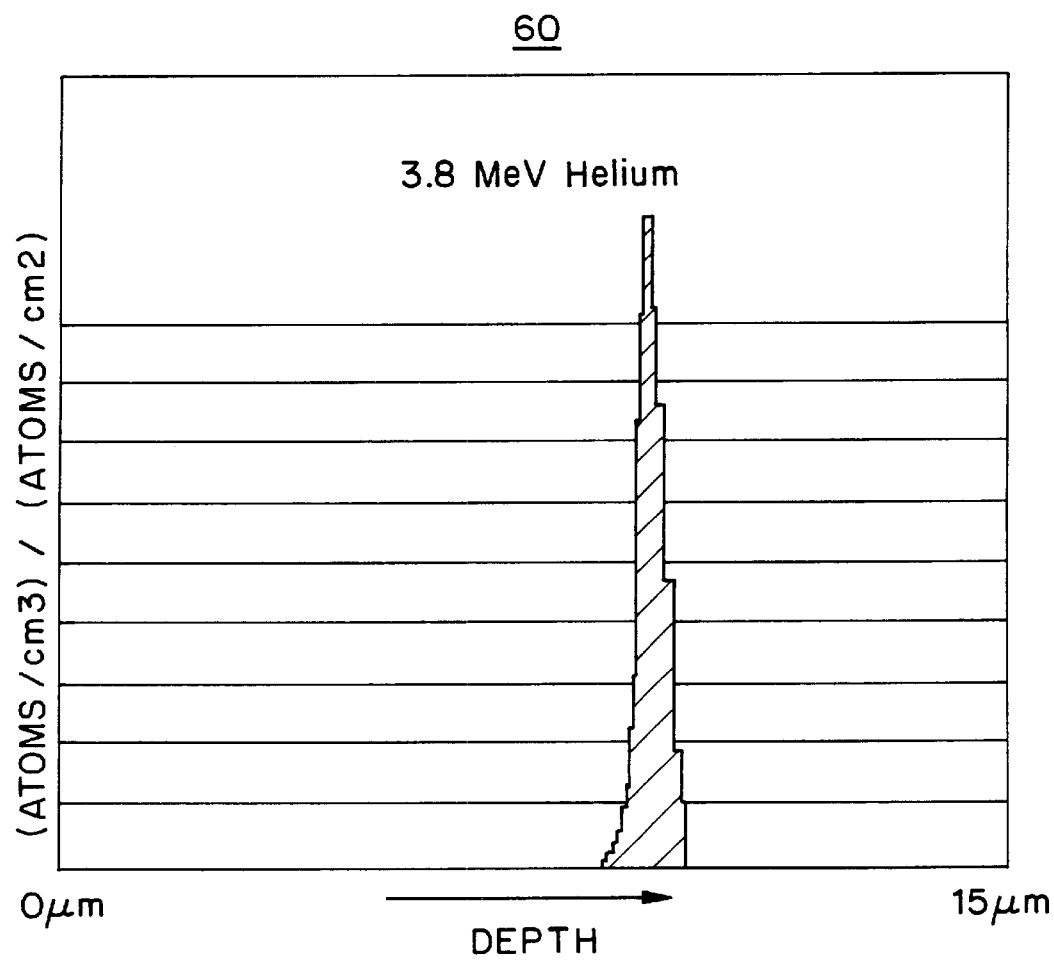
FIG. 6 is a graphical representation of an implantation distribution for 3.8 MeV helium ions in yttrium iron garnet.

FIG. 6 shows an implantation distribution profile for helium ions implanted at 3.8 MeV of energy into a YIG/GGG crystal structure. The implantation distribution profile of FIG. 6 is based on simulation results from transport-ofions-in-matter (TRIM) calculations, which match actual implantation distribution values for helium ions implanted at 3.8 MeV of energy into a YIG/GGG crystal structure. Advantageously, the implantation profile is narrow and concentrated at approximately 9 µm below the surface of the crystal structure. The implantation distribution profile for helium ions implanted at 3.8 MeV of energy into a Bi—YIG/GGG crystal structure exhibits an almost identical implantation depth.

Referring again to the preferred method 20 of FIG. 2, the ion implantation step 22 is followed by a chemical etching step for dissolving the damage, or "sacrificial," layer from the crystal structure substrate. Preferably, the chemical etching step is liquid chemical etching. Once the damage layer is dissolved by the chemical etching step, the single-crystal film detaches from the substrate and becomes available for transfer and bonding onto a growth-incompatible substrate.

Figure 7A:
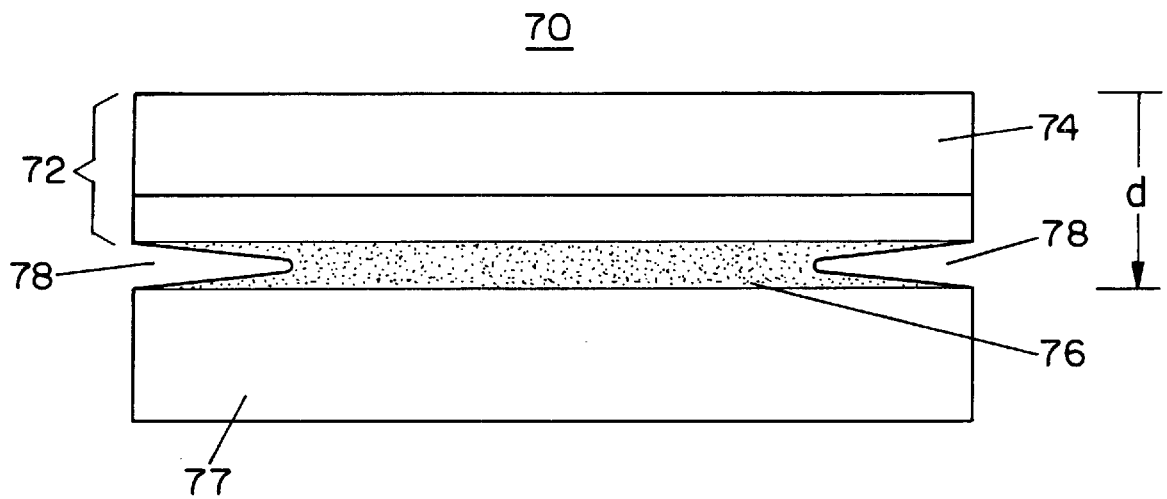
FIGS. 7A and 7B are side and top views, respectively, showing an etching step according to the crystal ion-slicing method of FIG. 2.
Figure 7B:
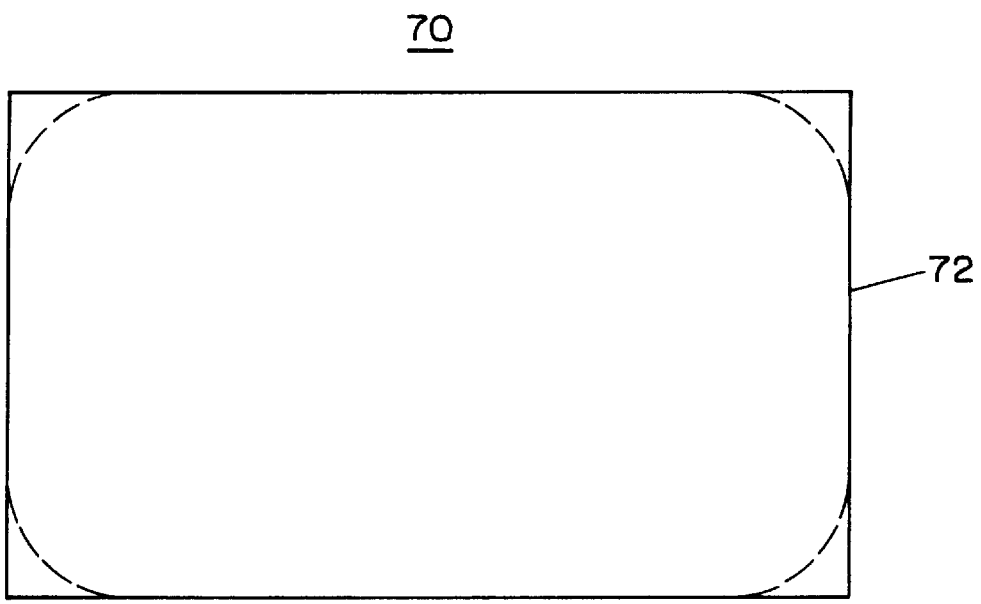

FIGS. 7A and 7B are side and top views, respectively, showing an etching step according to the crystal ion-slicing method of FIG. 2. As shown in FIG. 7A, a chemical etchant is applied to an epilayer/substrate crystal structure 70 having a substrate 77, an epilayer 74 formed on a top surface of the substrate 77, and a damage layer 76. After the appropriate etching period, the chemical etchant causes the damage layer 76 to dissolve away and the single-crystal film 72 to become detached from the substrate 77. The effect of the chemical etchant is the same whether the damage layer 76 is formed within the substrate 77 or within the epilayer 74 itself. The etch rate, however, may be vary depending upon whether the damage layer 76 is formed within the substrate 77 or within the epilayer 74.

Preferably, a commercial 85%-dilution orthophosphoric acid is used as the chemical etchant for detaching YIG/Bi—YIG single-crystal films from YIG/GGG or Bi—YIG/GGG crystal structures. Furthermore, to speed up the chemical etching process, the orthophosphoric acid is advantageously stirred and maintained at a constant temperature, preferably 70° C. The temperature of the acid can be further increased to achieve faster etching rates.

Nominally, the etchant is applied to the crystal structure 70 for 24 to 48 hours depending upon the size of the single-crystal film to be detached. As further shown in FIG. 7A, a deep undercut 78 forms in the substrate 77 after several hours of exposure to the chemical etchant. With reference to the implantation steps as shown in FIG. 4, for example, the undercut (not shown) is centered at approximately 9 µm below the top surface of the YIG/GGG crystal structure 40 in accordance with the implantation distribution profile of FIG. 6. After etching, the substrate 47 is detached leaving the single-crystal film with an underside that is microscopically smooth and suitable for bonding unto a growth-incompatible substrate.

The differential etch rate between sacrificial layer and the rest of the crystal structure is determined by comparing the etch rate of the undercut 78 to that of the top surface of the under the same conditions. The latter is determined by masking a section of the top surface with silicon dioxide and measuring the etch step with a profilometer. The degree of undercut is measured using Nomarski prism microscopy, or by cleaving off a section of the single-crystal film overhang. The etch selectivity, defined as the ratio of etch rate of the sacrificial layer to the etch rate of the top surface, is found to be in excess of $10^3$.

For detaching $LiNbO_3$ single-crystal films from bulk crystal structures such as the one shown in FIG. 5, 5% diluted hydrofluoric acid is preferred for chemically etching the "sacrificial" layer from the $LiNbO_3$ bulk crystal structure. The etching is performed at room temperature for 24 hours or less for detaching a 1 $mm^2$ sample of the $LiNbO_3$ single-crystal film.

As illustrative examples of the present invention, the crystal ion-slicing method of FIG. 2 has been used to detach magnetic garnet material layers from a GGG substrate. In one example, 10 µm and 95 µm-thick YIG epilayers were grown by liquid phase epitaxy on a GGG substrate containing small amounts of lanthanum to improve lattice matching to the GGG substrate. In another example, 3 µm-thick Bi—YIG thin-films are also grown on a GGG substrate. In both cases, the method of FIG. 2 was used to detach high quality single-crystal films approximately 9 to 10 µm-thick from the original substrates. The single-crystal films were then bonded by van der Waals force to growth-incompatible substrates such as silicon and gallium arsenide substrates. Faraday contrast examination of the magnetic domains of the single-crystal films indicated no change in the domain structure and coercivity of the garnet materials as a result of the crystal ion-slicing process.

Referring again to the preferred method of FIG. 2, the chemical etching step may however result in residual lattice damage, surface roughening or corner fracturing of the top surface of the single-crystal film. For example, using a surface profilometer, six hours of exposure to the etchant under typical etching conditions has been shown to yield an average roughness of 20 nm in the YIG/GGG example of FIG. 4. In addition, corner fracturing may occur during the chemical etching step as shown by the broken lines of FIG. 7B. Consequently, additional protective measures are required to minimize damage to the single-crystal film and to ensure the production of high quality thin-films.

Figure 8:
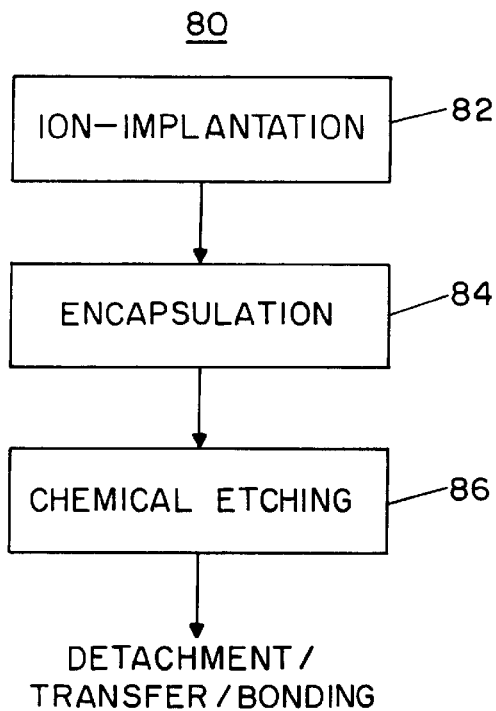
FIG. 8 is a flow diagram representing a preferred method for crystal ion-slicing whereby damage to the single-crystal film is minimized by encapsulation.

FIG. 8 therefore shows a preferred method 80 for crystal ion-slicing a single-crystal film from a crystal structure whereby residual lattice damage and surface roughening is minimized by encapsulation. The method 80 includes the steps of implanting ions into a crystal structure to form a damage layer within the substrate (Step 82), encapsulating the top surface of the single-crystal film (Step 84), and chemically etching the damage layer from the substrate (Step 86). According to a preferred aspect of the present invention, the corners of the single-crystal film 72 of FIG. 7 are encapsulated with molten wax or an Apiezon W mixture to prevent fracturing of the single-crystal film due to the residual lattice damage and surface roughening caused by the subsequent chemical etching step.

Figure 9:
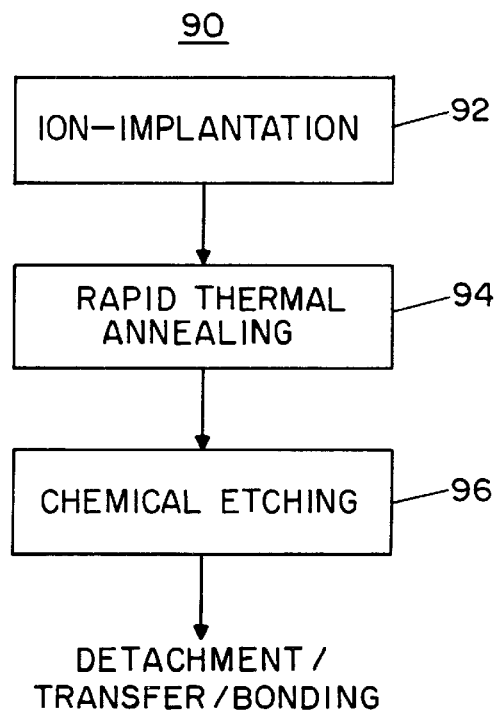
FIG. 9 is a flow diagram representing a preferred method for crystal ion-slicing whereby residual lattice damage and surface roughening is minimized by rapid thermal annealing.

FIG. 9 shows a preferred method for crystal ion-slicing a single-crystal film from a crystal structure whereby residual lattice damage and surface roughening is minimized by rapid thermal annealing (RTA). The method 90 includes the steps of implanting ions into a crystal structure to form a damage layer within the substrate (Step 92), rapid thermal annealing (Step 94) and chemical etching of the damage layer from the substrate (Step 96). Preferably, the chemical etching step is liquid chemical etching.

As shown in FIG. 9, the rapid thermal annealing step (Step 94) is performed after the ion implantation step (Step 90) but before chemical etching step (Step 96). Again, preferably the chemical etching step is liquid chemical etching. The rapid thermal annealing serves to repair the residual damage without compromising the efficiency of the subsequent wet etching of the buried damage layer. Preferably, a 40 second anneal at 700° C. in forming gas comprised of 5% hydrogen and 95% nitrogen results in a smooth surface and thus high-quality single-crystal films.

By contrast, a rapid temperature annealing step performed at temperatures above 800° C. is undesirable since it significantly impairs the etch rate of the buried layer by annealing out the damage in the "sacrificial" layer. Consequently, the method of FIG. 9 including the rapid temperature annealing step (Step 94) performed at approximately 800° C. will reduce the etch rate associated with the subsequent chemical etching step (Step 96) as compared to a method not including the rapid temperature annealing step (Step 94). Preferably, the chemical etching step is liquid chemical etching.

Referring again to the preferred method of FIG. 2, the duration of the chemical etching step 24 is nominally 24 to 48 hours depending upon the size of single-crystal film to be detached. For example, to fully detach a square-millimeter area section of film from a substrate, the crystal structure must be exposed to the etchant for approximately 24 to 48 hours.

Figure 10:
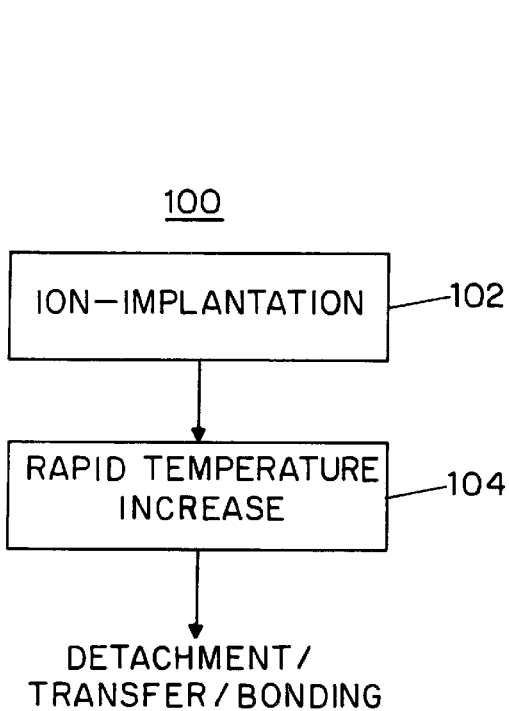
FIG. 10 shows a preferred method for crystal ion-slicing whereby the crystal structure is exposed to a rapid temperature increase.

Therefore, as a faster alternative to the method of FIG. 2, FIG. 10 shows another preferred method 100 for crystal ion-slicing a single-crystal film, from either an epilayer/substrate or bulk crystal structure, whereby the crystal structure is exposed to a rapid temperature increase to effect detachment of the single-crystal film from the growth-compatible substrate without chemical etching. The method 100 includes the steps of implanting ions into a crystal structure below the epilayer/substrate interface to form a damage layer within the growth-compatible substrate (Step 102), and subjecting the crystal structure to a rapid temperature increase so as to effect the detachment or "snap-off" of the single-crystal film from the growth-compatible substrate (Step 104). Step 104 of FIG. 10 includes raising the temperature of the crystal structure from room temperature to approximately 750 to 800° C. within 60 seconds. Detachment of the single-crystal film is thereby achieved by maintaining the temperature of the crystal structure at approximately 750 to 800° C. for approximately 30 seconds.

As an additional step, the crystal structure may be chemically treated during or before ion implantation with a chemically enhancing gas, such as chlorine gas, or liquid to enhance detachment of the single-crystal film. Chemical treatment of the damage layer may also be performed so as to minimize the degree of the rapid temperature increase required to effect detachment of the single-crystal film from the crystal structure.

Figure 11:
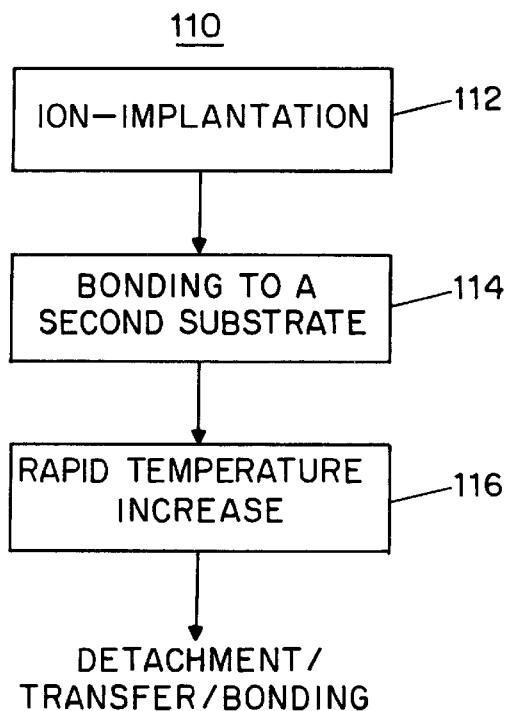
FIG. 11 is a flow diagram representing a preferred method for crystal ion-slicing whereby the crystal structure is bonded to a second substrate and is exposed to a rapid temperature increase.

FIG. 11 shows a preferred method 110 for crystal ion-slicing a single-crystal film from a crystal structure whereby the crystal structure is bonded, directly or indirectly, to a second substrate and exposed to a rapid temperature increase to detach the single-crystal film from the growth-compatible substrate. The method can be used with the epilayer/substrate crystal structure of FIG. 1A and as further shown in FIGS. 12 and 13, or the bulk crystal structure of FIG. 1B without chemical etching.

Referring again to FIG. 11, the method 110 includes the steps of implanting ions into a crystal structure to form a damage layer within the crystal structure (Step 112), bonding the top surface of the implanted crystal structure, either directly or indirectly, to a second substrate (Step 114), and subjecting the crystal structure to a rapid temperature increase so as to effect the detachment or "snap-off" of a single-crystal film from the crystal structure (Step 116) without chemical etching. As with the method of FIG. 10, the exposure step (Step 116) includes raising the temperature of the crystal structure from room temperature to approximately 750 to 800° C. within 60 seconds. Detachment of the single-crystal film is thereby achieved by maintaining the temperature of the crystal structure at approximately 750 to 800° C. for at approximately 30 seconds.

The second substrate according to the bonding step (Step 112) is advantageously bonded directly onto the top surface of the crystal structure, preferably by the technique of direct wafer bonding as described by Yokoi et al. in "Improved heat treatment for wafer direct bonding between semiconductors and magnetic garnets," Japan Journal of Applied Physics, vol 36, p. 2784 (1997) which is incorporated herein by reference. The second substrate can be a semiconductor such as silicon or GaAs. This method is advantageous in that the single-crystal film layer remains bonded to the second substrate after the single-crystal film is detached from the crystal structure.

Alternatively, the method of FIG. 11 may include the step of applying a low-temperature bonding layer between the top surface of the implanted crystal structure and the second substrate. The function of the low-temperature bonding layer is to avoid annealing out the damage or sacrificial layer during the detachment process. This technique is the same regardless of whether an epilayer/substrate or bulk crystal structure is used.

Figure 12:
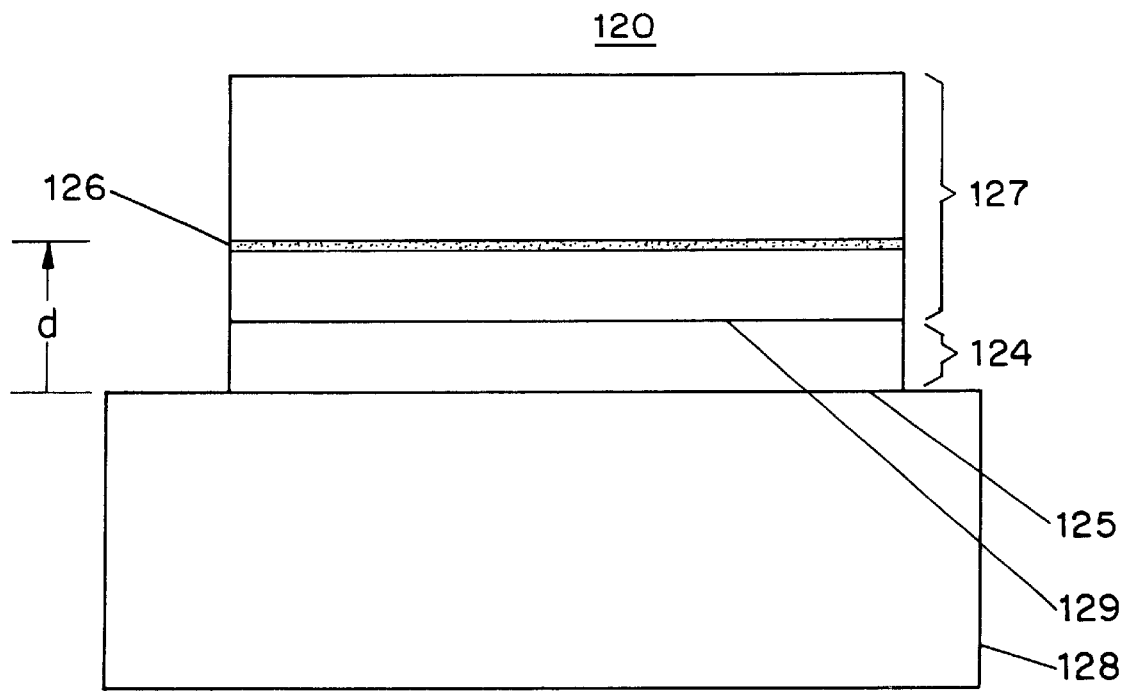
FIG. 12 is a side view showing a modified crystal structure for use with the method of FIG. 11 wherein a second substrate is bonded directly onto the top surface of a single-crystal film.

FIG. 12 shows a modified crystal structure 120 for use in the preferred method of FIG. 11. By way of example and not limitation, the modified crystal structure 120 is similar to the epilayer/substrate crystal structure shown in FIG. 1A. The modified crystal structure 120 includes a first growth-compatible substrate 127, the second substrate 128, an epilayer 124 formed between the first and second substrates 127 and 128, and a damage layer 126 formed in the first substrate 127 a depth d from the interface 125 between the epilayer 124 and the second substrate 128. The epilayer 124 is preferably bonded together to the second substrate 128 by direct wafer bonding. The epilayer 124 is preferably a layer of magnetic garnet or ferroelectric material grown on the first substrate 127 such as GGG or other growth-compatible substrate.

Figure 13:
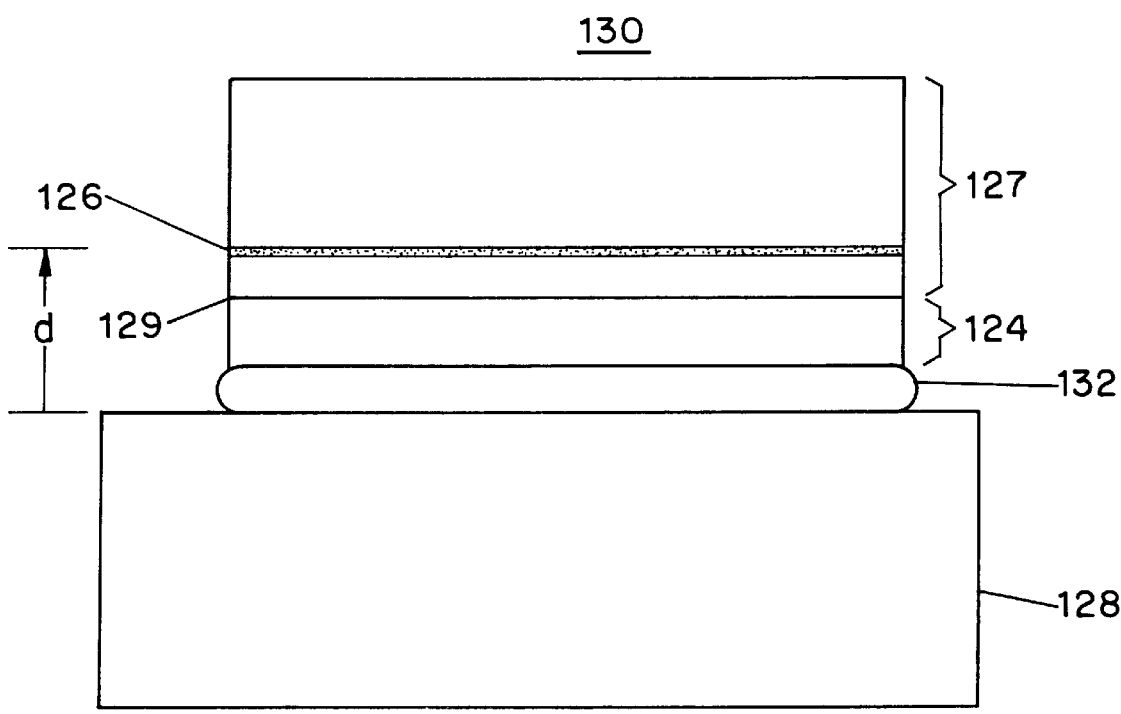
FIG. 13 is a side view showing a modified crystal structure for use with the method of FIG. 11 wherein a second substrate is bonded indirectly onto the top surface of a single-crystal film.

FIG. 13 shows another modified crystal structure 130 for use in the preferred method of FIG. 11 wherein the second substrate 128 is indirectly bonded to the epilayer 124. As shown in FIG. 13, the modified crystal structure 130, by way of example and not limitation, includes a first, growth-compatible substrate 127, a second substrate 128, an epilayer 124 formed on the first substrate 127, a bonding layer 132 formed between the epilayer 124 and the second substrate 128, and a damage layer 126 formed in the first substrate 127 a depth d from the interface 125 between the bonding layer 132 and the second substrate 128.

As shown in FIG. 13, the epilayer 124 is preferably a layer of magnetic garnet or ferroelectric material mounted between the first substrate 127, which is preferably a GGG or other growth-compatible substrate. The bonding layer 132 is preferably a low temperature melting material, such as low temperature melting glass, which has a melting point lower than the 750 to 800° C. temperature plateau of Steps 104 and 116 of FIGS. 10 and 11, respectively.

Further with respect to crystal ion slicing of bulk crystal structures, it has been noted that the step of rapid thermal annealing step when performed after an ion implantation step but before chemical etching step serves to repair residual damage without compromising the efficiency of the subsequent wet etching of the buried damage layer. Advantageously, the step of rapid thermal annealing prior to chemical etching can also be used to enhance the etch selectivity of a single-crystal film. In particular, the step of rapid thermal annealing according to the present invention has been shown to dramatically reduce the fabrication time and improve the surface morphology of single-crystal films made from ferroelectric bulk materials such as lithium niobate (LiNbO$_3$) and lead zinc niobate (PZN).

The ability to efficiently mass produce single-crystal LiNbO$_3$ and PZN films, or other films made from similar or equivalent ferroelectric materials, is important due to the superior optical and dielectric properties of the materials. Because of their optical and dielectric properties, the materials are especially useful in fiber optic communications systems, tunable piezoelectric devices for wireless communications, and micromechanical applications. In particular, LiNbO$_3$ is especially useful for modulation, optical switching, amplification and frequency conversion of optical signals.

Figure 14:
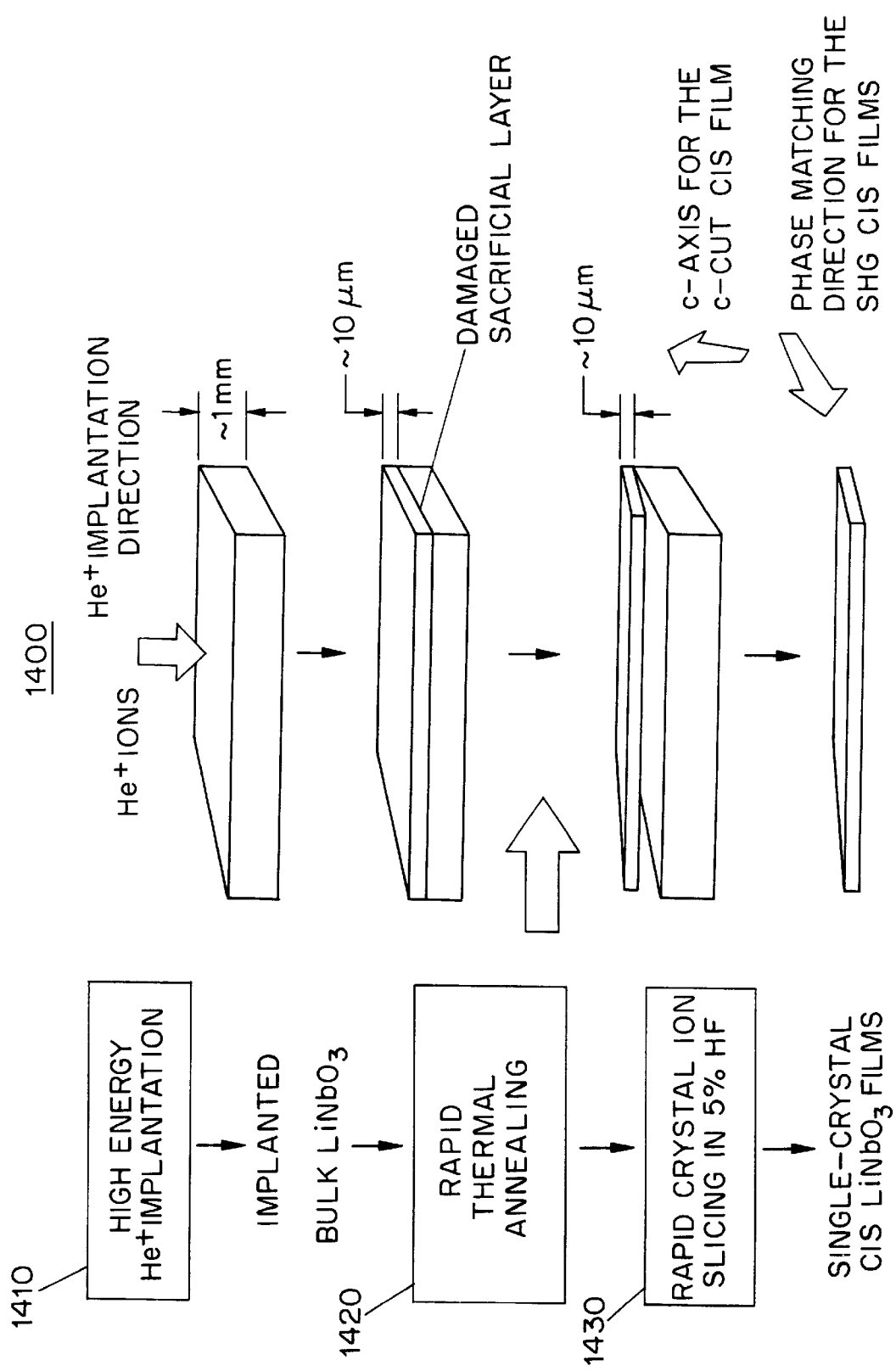
FIG. 14 diagrammatically illustrates a crystal ion-slicing method for enhancing the etch selectivity of a single-crystal $LiNbO_3$ film.
Figure 15:
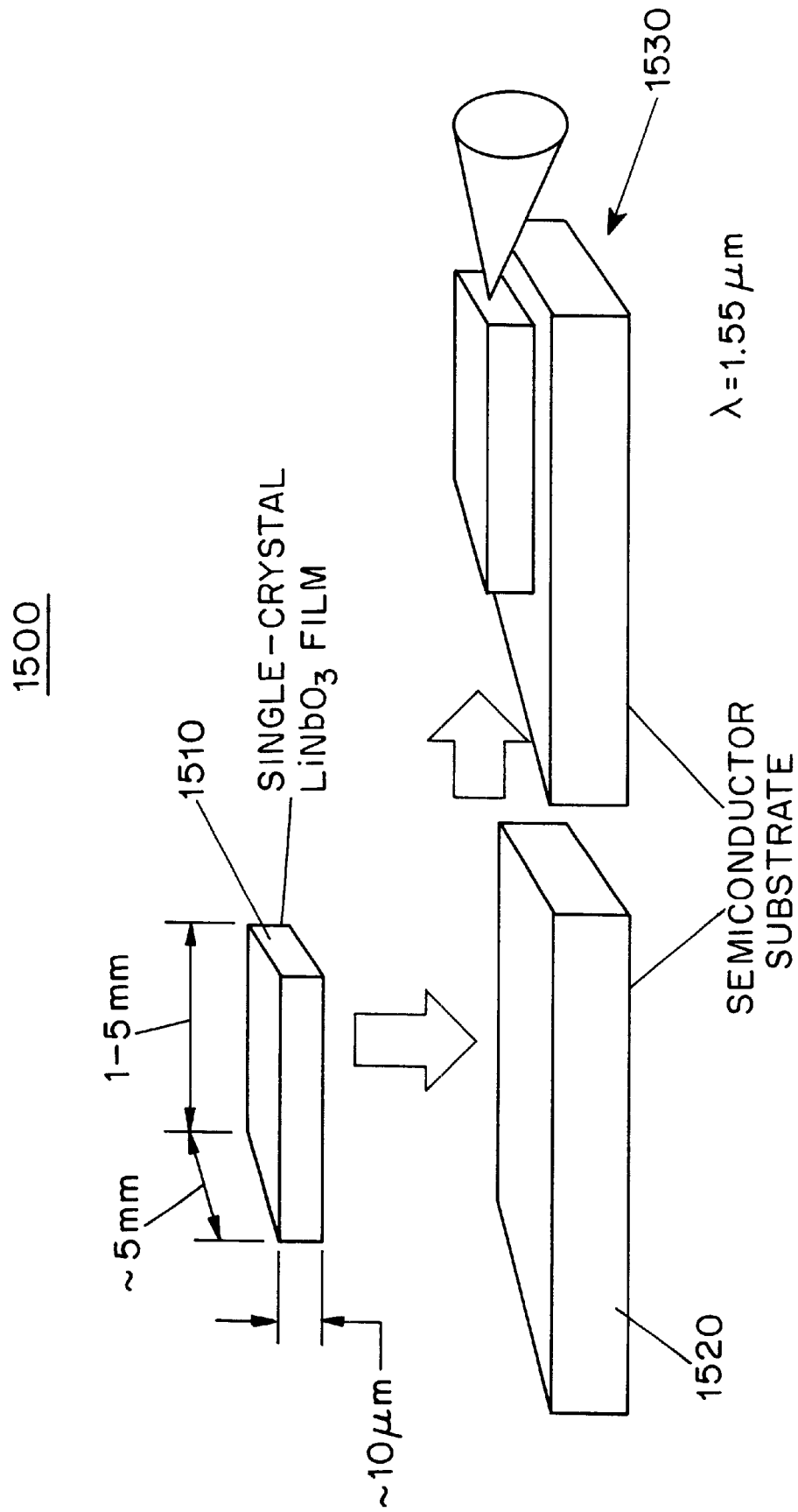
FIG. 15 diagrammatically illustrates an example of an optoelectronic device having a single-crystal $LiNbO_3$ film fabricated in accordance with the method of FIG. 14.
Figure 16:
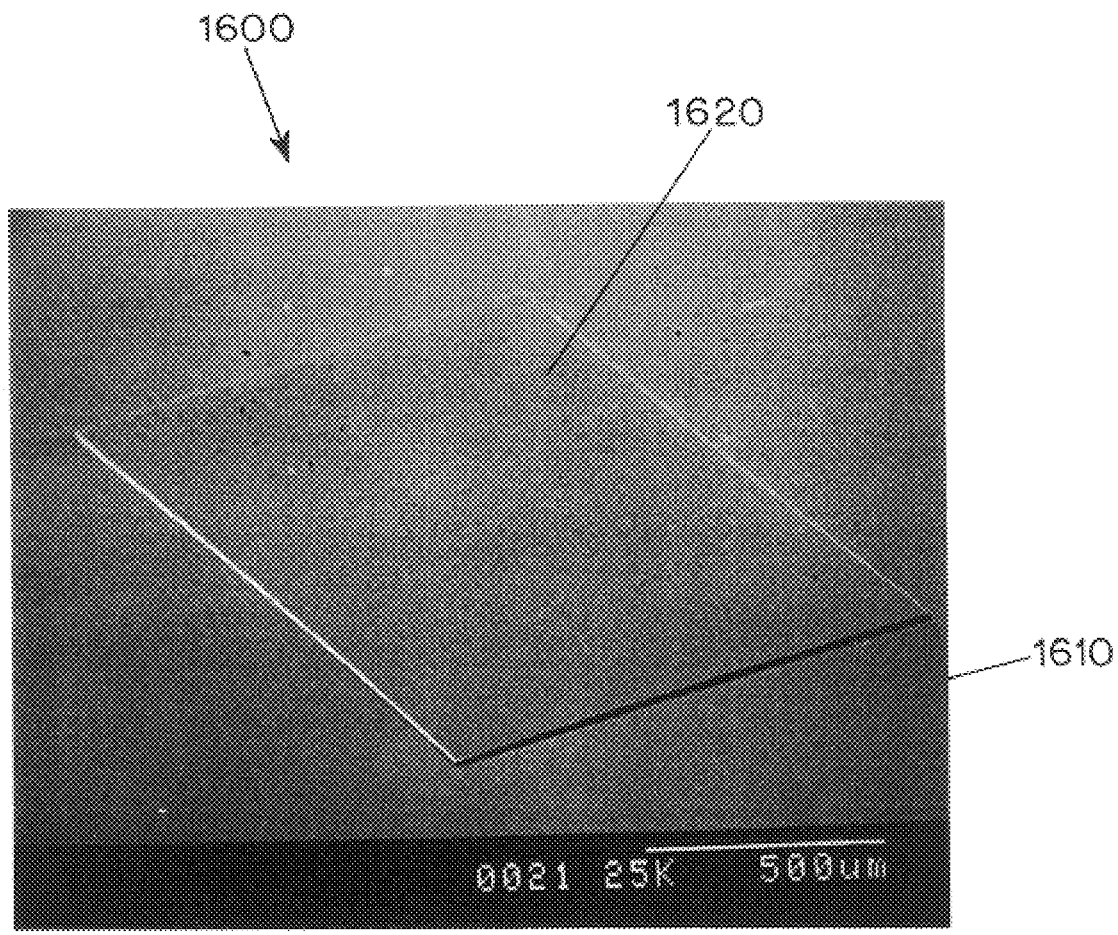
FIG. 16 is a scanning electron micrograph of crystal ion-sliced single-crystal $LiNbO_3$ film deposited on a glass substrate.

FIG. 14 further illustrates a crystal ion-slicing method for enhancing the etch selectivity of a single-crystal LiNbO$_3$ film. As shown in FIG. 14, the method includes the steps of implanting ions into LiNbO$_3$ bulk crystal structure to form a damage layer within the bulk crystal structure (Step 1410), rapid thermal annealing the ion-implanted bulk crystal structure (Step 1420), and chemical etching of the ion-implanted bulk crystal structure so as to remove the damage layer and thereby detach a thin single-crystal film from the bulk crystal structure (Step 1430). Preferably, the chemical etching step is liquid chemical etching. By performing the rapid annealing step prior to chemical etching, the time required for detaching the single-crystal film can be reduced by as much as a factor of 100. As such, large (0.5×1 cm$^2$) 5 to 10 μm-thick single-crystal LiNbO$_3$ films of excellent quality can be detached from a bulk crystal in a just matter of a few hours. The single-crystal LiNbO$_3$ film 1510 or 1610 can then be bonded onto a growth-incompatible semiconductor substrate 1520 or glass substrate 1610 as shown in FIGS. 15 and 16, respectively. In FIG. 15 the resulting structure 1530 is obtained.

Figure 17:
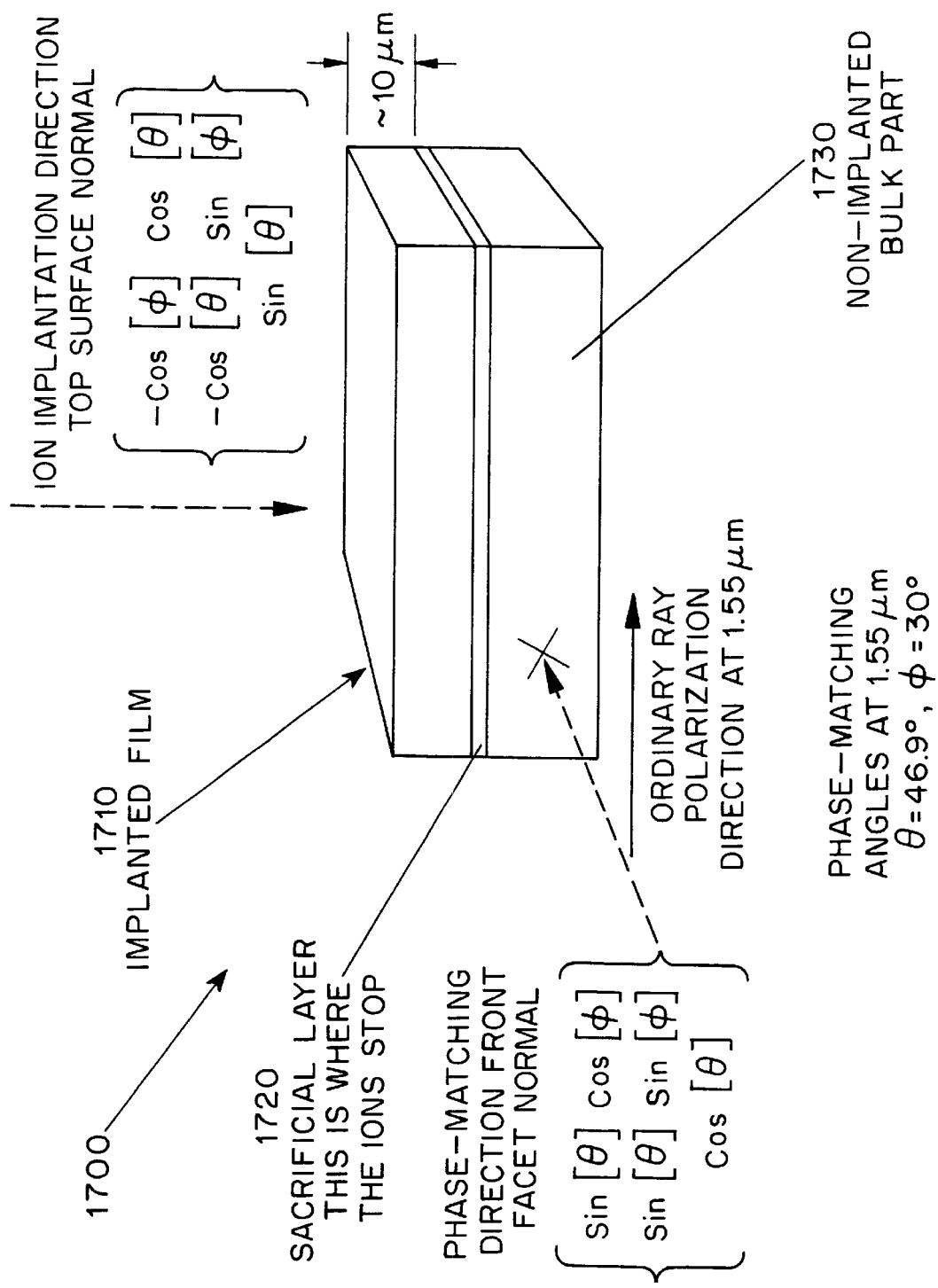
FIG. 17 is an isometric view illustrating the ion implantation direction for $LiNbO_3$ films obtained from bulk $LiNbO_3$ cut for second harmonic generation (SHG) at a wavelength of 1.55 $\mu$m.

The above-described method of FIG. 14 has been used to fabricate single-crystal LiNbO$_3$ films using two types of bulk crystal geometries: c-cut and phase-matched for second harmonic generation (SHG) crystals. A bulk LiNbO$_3$, c-cut in one case and a phase-matched for SHG at 1.55 μm in the other (θ=46.9°, φ=30.0°), were cut from a c-poled single crystal boule grown by the Czochralski method. For the SHG films, as shown in FIG. 17, the samples were sliced along the plane defined by the phase-matching direction and the ordinary ray (o-ray) polarization direction at 1.55 μm. The samples were then implanted with He$^+$ (5.0×10$^{16}$ cm$^{-2}$ dosage) at a tilt angle of 2–3° relative to the normal. Ionic energies ranging from 3.18 to 3.8 MeV were used to vary the corresponding implantation depths between 8 to 10 μm. Irrespective of the ion energy, however, the straggle in the projected ion range remained almost unchanged, i.e., the implantation distribution spread in the damage layer was not a strong function of the implantation energy. As a result of the implantation step, the implanted helium ions do not go into solid solution in the host matrix, but rather coalesce in the damage layer so as to generate additional vertical stresses on the film and bulk structure sides of the damage layer. Other ion species, such as hydrogen or boron, having different implantation energies and dosages may also be used for the implantation step.

Next, the ion implanted LiNbO$_3$ bulk crystals were subjected to rapid thermal annealing in a 5% H$_2$, 95% N$_2$ forming gas at a temperature of 300 to 750° C. for up to approximately 45 seconds. Annealing temperatures however can range from about 250 to 800° C., but preferably 300° C. for SHG films and 400° C. for c-cut films. The annealed bulk crystals were then chemically etched in a 5% hydrofluoric acid to effect detachment of the single-crystal LiNbO$_3$ film from the bulk substrate.

For fabricating single-crystal PZN films, however, an ion implanted PZN bulk crystal is preferably annealed at 700 to 750° C. for 30 to 45 seconds and then immersed in a 38% hydrochloric acid. As such, an undercut is formed in the damage layer such that a microns-thick PZN single-crystal film is completely detached from the bulk PZN after only a few hours. For example, PZN single-crystal films of 3–7 mm (length)×0.4 mm (width)×10 μm (thickness) in size are completely detached after about 4–5 hours in 38% HCl, resulting in an etch rate of approximately 45 μm/min/film facet. The critical, most time consuming film dimension is the film width.

Figure 18A:
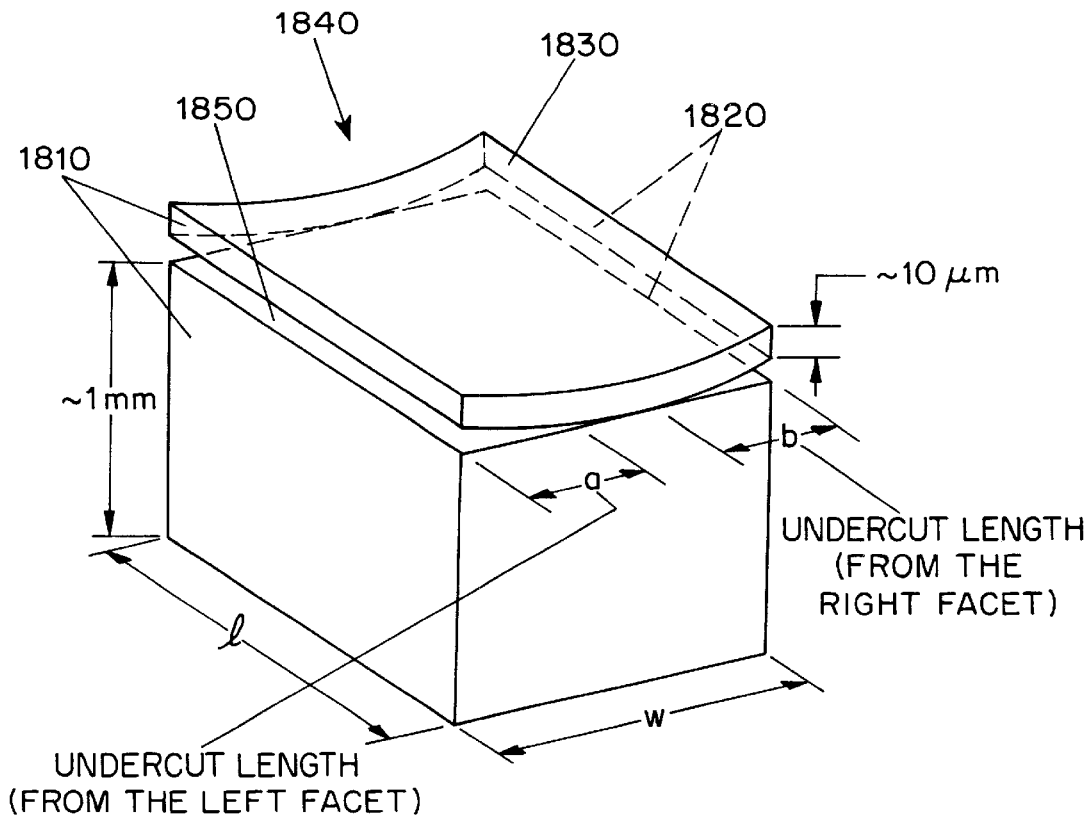
FIGS. 18A and 18B are isometric and top views, respectively, illustrating the undercut formation in a bulk crystal structure in accordance with the method of FIG. 14.
Figure 18B:
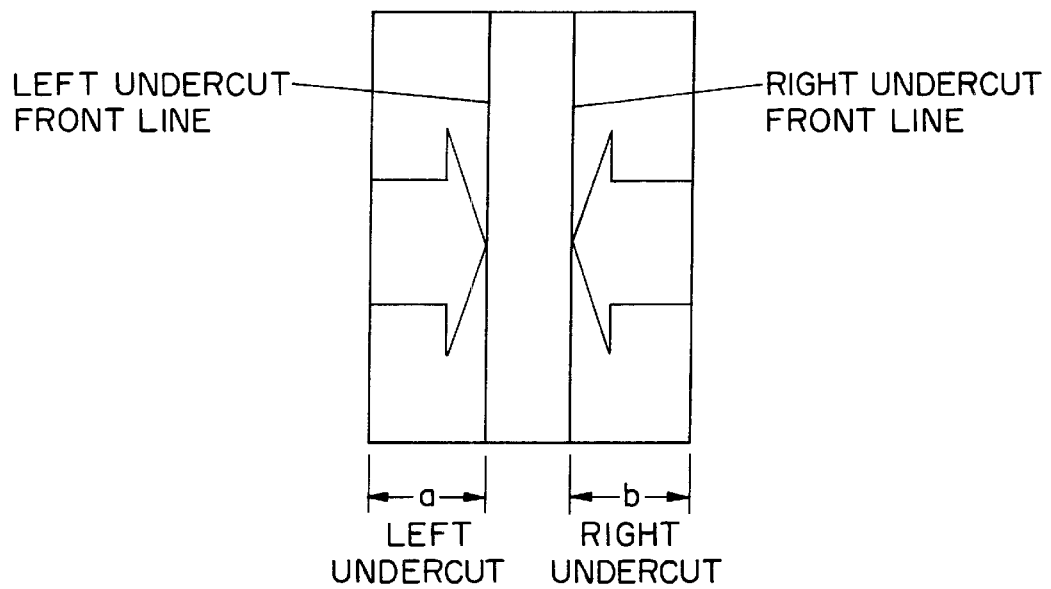

FIGS. 18A and 18B are isometric and top views, respectively, of a bulk crystal 1840 illustrating how the chemical etching step causes a single-crystal film 1830 to detach from a bulk crystal structure 1840. As shown in FIGS. 18A and 18B, left and right undercut regions a and b form along the width w of the bulk crystal structure 1840 from the left and right facets, 1810 and 1820 respectively, in the damage layer 1850 of the bulk crystal structure 1840. The undercut regions a and b uniformly progress towards the center of the bulk crystal 1840 until the single-crystal film 1830 becomes detached from the bulk crystal 1840. The corresponding undercut lengths are easily determined using Nomarski-prism optical microscopy to measure the extent of the interference pattern created by the air gap between the partially lifted-off film and the substrate, as shown in FIG. 18B.

Figure 19A:
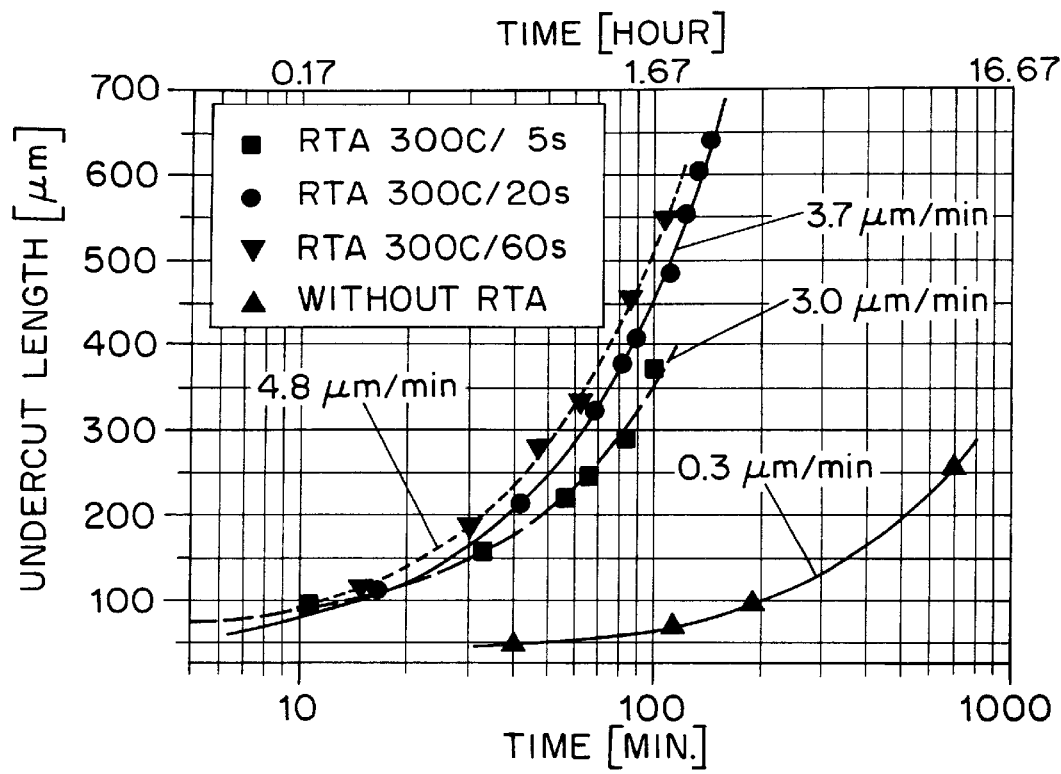
FIGS. 19A and 19B are graphical representations of undercut length versus time data showing the effect of rapid thermal annealing on undercut time in a SHG LiNbO3 bulk crystal implanted with 3.8 MeV $He^+$ (FIG. 19 A, etch rate enhancement factor >15) and 3.18 MeV $He^+$ (FIG. 19A, etch rate enhancement factor >140), respectively.
Figure 19B:
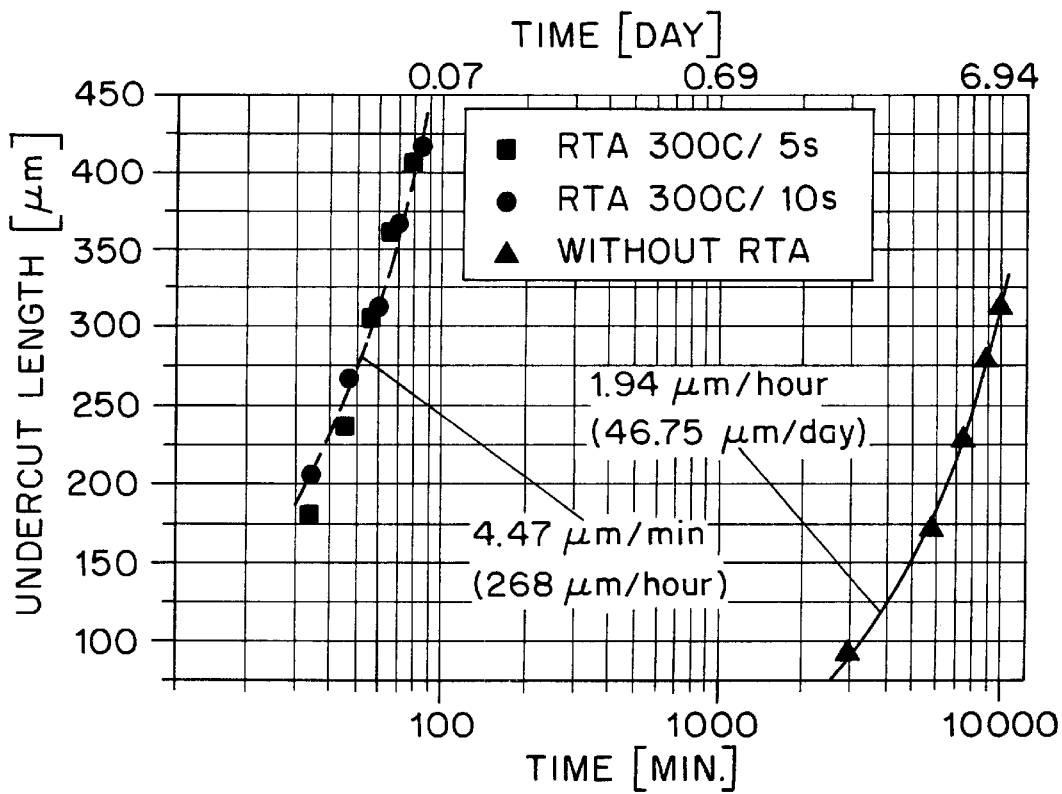

FIG. 19B shows graphs comparing etch rates, i.e., undercut length versus time, with and without rapid thermal annealing (RTA), for SHG oriented and 3.18 MeV implanted LiNbO$_3$ bulk crystals annealed at 300° C. As shown in FIG. 19B, for example, the etch rates corresponding to the annealed LiNbO$_3$ bulk crystals (annealing exposures of 5 and 10 seconds) are on the order of 140 times faster than without rapid thermal annealing, i.e., approximately 50 μm/day/film facet without rapid thermal annealing. Similarly, as shown in FIG. 19A, the etch rates for annealed 3.8 MeV implanted LiNbO$_3$ bulk crystals are much faster as compared to an unannealed LiNbO$_3$ bulk crystal sample, i.e., approximately 20 μm/hour/film facet without rapid thermal annealing. The annealed samples in fact exhibit a uniform undercut formation after only approximately 2 minutes in the etchant.

Thus, the enhanced etch rates shown in FIGS. 19A and 19B allow for faster and more controllable and reliable fabrication of single-crystal films. A single-crystal film of excellent surface quality and as large as 20 to 50 mm$^2$ can be detached in just a few hours. Table 1 below shows comparative etch rates and in addition suggests that longer annealing exposures yield higher etch rates:

TABLE 1

Etch Rates With and Without Rapid Thermal Annealing

| Sample | Rates With RTA (μm/min) | Rates Without RTA (μm/min) |
|---|---|---|
| 3.18 MeV SHG | ~4.5 (RTA @ 300° C./30 s) | ~0.033 |
| 3.8 MeV SHG | ~5.0 (RTA @ 300° C./60 s) | ~0.33 |

TABLE 1-continued

Etch Rates With and Without Rapid Thermal Annealing

| Sample | Rates With RTA (μm/min) | Rates Without RTA (μm/min) |
|---|---|---|
| 3.8 MeV c-cut | ~3.0 (RTA @ 400° C./30 s) | ~0.33 |

Table 1, for example, shows that for c-cut single-crystal LiNbO$_3$ films having an implantation energy of 3.8 MeV, etch rates of approximately 0.33 μm/min/film facet (20 μm/hour/film facet) are increased to approximately 3 μm/min/film facet (180 μm/hour/film facet) when rapid thermal annealing is performed at 400° C. for 30 seconds. As a result, the complete crystal ion-slicing of a 2 mm×10 mm bulk sample requires approximately 5 hours, which is approximately 1.5 times the etch time of the annealed SHG samples. Thus, the etch rates achieved by rapid thermal annealing are shown to be nearly independent of crystallographic orientation and implantation energy.

Figure 20:
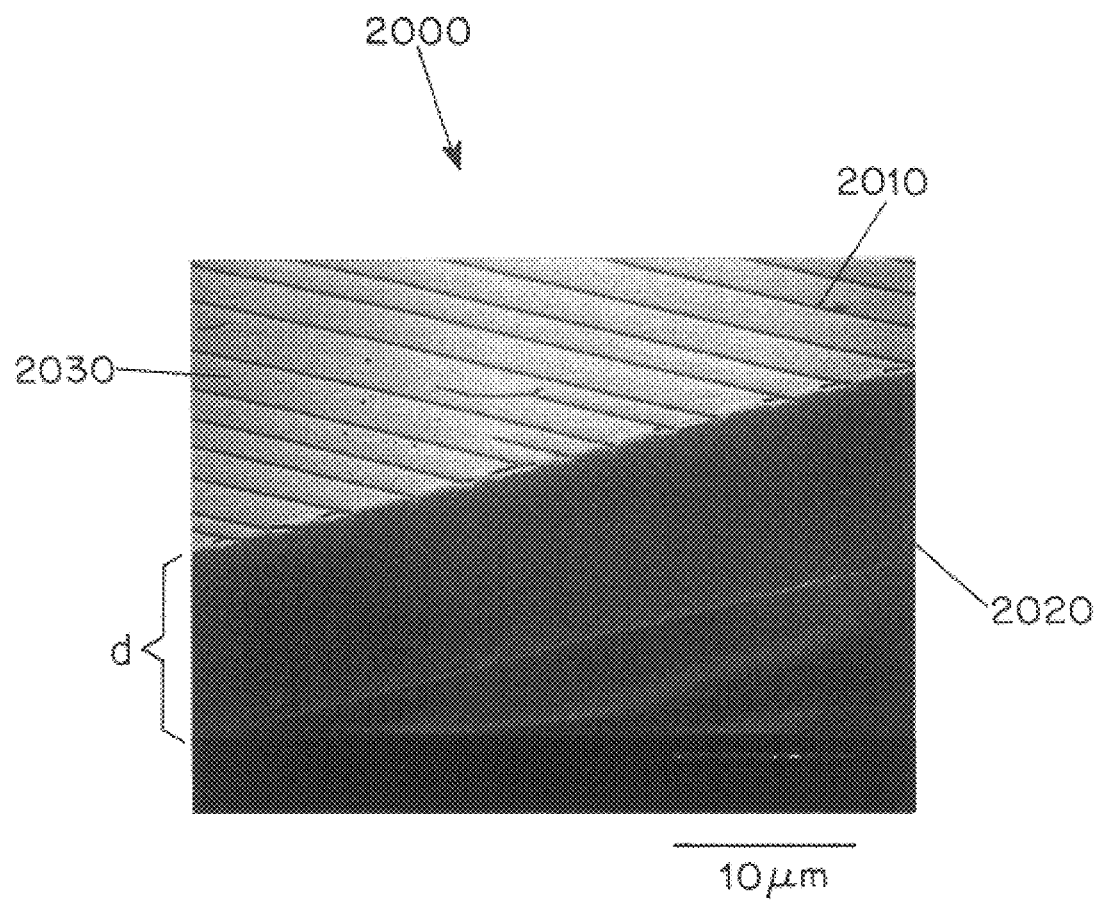
FIG. 20 is a scanning electron micrograph of a single-crystal $LiNbO_3$ film oriented for SHG (3.8 MeV $He^+$ implantation, rapid thermal annealing at 300° C./60 seconds) showing underside grooves in the phase-matched direction.

FIG. 20 is a scanning electron micrograph of a freestanding single-crystal LiNbO$_3$ film 2000 oriented for SHG (3.8 MeV He$^+$ implantation, RTA at 300° C./60 seconds) with the underside surface 2030 facing up. Although the top surface 2020 remains smooth, the underside surface 2030 is covered with shallow parallel grooves 2010 that are approximately 0.1 μm deep oriented along the phase-matching direction. The grooves 2010 are crystal-orientation dependent and stem from the interaction of the implantation charge with the ferroelectric polarization during the implantation and etching process. This phenomenon, however, has not been found to degrade the dielectric and optical properties of freestanding single-crystal LiNbO$_3$ films.

The shallow grooves 2010 observed on the underside 2030 of the SHG film of FIG. 20 are also seen in c-cut films and are of comparable depth. The difference, however, lies in the structure and orientation of the lines, as in the latter case the grooves form a trigonal pattern. See M. Levy, R. M. Osgood, Jr., R. Liu, L. E. Cross, G. S. Cargill III, A. Kumar and H. Bakhru, *Appl. Phys. Lett.*, vol. 73, p. 2293 (1998).

FIGS. 21A and 21B show He$^+$ and Li area-normalized spectra, respectively, obtained as a result of a secondary ion mass spectroscopy (SIMS) performed on the c-cut and SHG crystalline orientations. The He$^+$ and Li area-normalized spectra are shown with and without RTA in 3.8 MeV He$^+$ implanted LiNbO$_3$ oriented for SHG. No He$^+$ loss is assumed during RTA and the offset in Li spectra is a measurement artifact.

As shown in FIGS. 21A and 21B, rapid thermal annealing causes a change in the He$^+$ and Li spectra in implanted samples oriented for SHG (c-cut implants have similar spectra). The figures show that the post-anneal He$^+$ distribution becomes a sharper and narrower spectra, thus yielding an increase in the internal pressure of the damage layer. Due to its low solid-solubility, He$^+$ tends to fill-in implantation-generated micro-voids. The high Li mobility allows it to be displaced and replaced by He$^+$. The peak in the He$^+$ spectrum is thus shifted deeper into the bulk crystal with increasing annealing exposure, while a depletion dip in Li spectra follows the same trend. This thermal migration or spatial displacement of internal voids and pressure buildup in the damage layer result in enhanced etch rates when the bulk crystal structure is annealed prior to etching.

In summary, we have presented various techniques for crystal ion slicing, including a novel technique for rapid thin thick single-crystal film processing wherein the etch selectivity of a single-crystal film is enhanced so as to significantly reduce the time required for the single-crystal film to detach from a bulk crystal structure.

Although the present invention has been described in connection with particular embodiments thereof, it is to be understood that various modifications, alterations and adaptations may be made by those skilled in the art without departing from the spirit and scope of the invention. It is intended that the invention be limited only by the appended claims.

What is claimed is:

1. A method for enhancing the detachment of a single-crystal film from a bulk crystal structure, comprising:
    implanting ions into said bulk crystal structure to form a damage layer at an implantation depth below a top surface of said bulk crystal structure, said top surface and said damage layer defining at least in part said single crystal film to be detached from said crystal structure;
    rapid thermal annealing said ion-implanted bulk crystal structure; and
    chemically etching said damage layer within said annealed bulk crystal structure to effect detachment of said single-crystal film from said bulk crystal structure.

2. The method according to claim 1, wherein said bulk crystal structure comprises a metal oxide material.

3. The method according to claim 1, wherein said bulk crystal structure comprises a ferroelectric material.

4. The method according to claim 1, wherein said bulk crystal structure comprises lithium niobate.

5. The method according to claim 1, wherein said bulk crystal structure comprises lead zinc niobate.

6. The method according to claim 1, wherein said bulk crystal structure has a c-cut orientation.

7. The method according to claim 1, wherein said bulk crystal structure has an orientation that provides phase-matching for second harmonic generation.

8. A method for enhancing the etch selectivity for detachment of a single-crystal film from a bulk crystal structure, comprising:
    implanting ions into said bulk crystal structure to form a damage layer at an implantation depth below a top surface of said bulk crystal structure, said top surface and said damage layer defining at least in part said single-crystal film to be detached from said crystal structure; and
    rapid thermal annealing said ion-implanted bulk crystal structure.

9. The method according to claim 8, wherein said bulk crystal structure comprises a metal oxide material.

10. The method according to claim 8, wherein said bulk crystal structure comprises a ferroelectric material.

11. The method according to claim 8, wherein said bulk crystal structure comprises lithium niobate.

12. The method according to claim 8, wherein said bulk crystal structure comprises lead zinc niobate.

13. The method according to claim 8, wherein said bulk crystal structure has a c-cut orientation.

14. The method according to claim 8, said bulk crystal structure has an orientation that provides phase-matching for second harmonic generation.

15. A method for enhancing the detachment of a single-crystal film from a ferroelectric bulk crystal structure, comprising the steps of:
    implanting ions into said bulk crystal structure to form a damage layer at an implantation depth below a top surface of said bulk crystal structure, said top surface and said damage layer defining at least in part said single-crystal film to be detached from said crystal structure;

rapid thermal annealing said ion-implanted bulk crystal structure; and chemically etching said damage layer within said annealed bulk crystal structure to effect detachment of said single-crystal film from said bulk crystal structure.

16. The method according to claim 15, wherein said bulk crystal structure comprises lithium niobate.

17. The method according to claim 15, wherein said bulk crystal structure comprises lead zinc niobate.

18. The method according to claim 15, wherein said bulk crystal structure has a c-cut orientation.

19. The method according to claim 15, wherein said bulk crystal structure has an orientation that provides phase-matching for second harmonic generation.

20. A method for enhancing the detachment of a single-crystal film from a metal oxide bulk crystal structure, comprising the steps of:

implanting ions into said bulk crystal structure to form a damage layer at an implantation depth below a top surface of said bulk crystal structure, said top surface and said damage layer defining at least in part said single-crystal film to be detached from said crystal structure;

rapid thermal annealing said ion-implanted bulk crystal structure; and chemically etching said damage layer within said annealed bulk crystal structure to effect detachment of said single-crystal film from said bulk crystal structure.

21. A method of fabricating an optoelectronic device, comprising:

implanting ions into a crystal structure to form a damage layer at an implantation depth below a top surface of said crystal structure;

chemically etching said damage layer to effect detachment of a single-crystal film from said crystal structure; and bonding said single-crystal film to a growth-incompatible substrate.

22. A method of fabricating an optoelectronic device, comprising:

implanting ions into a crystal structure to form a damage layer within said crystal structure at an implantation depth below a top surface of said crystal structure;

subjecting said damage layer to a rapid temperature increase to effect detachment of a single-crystal film from said crystal structure; and bonding said single-crystal film to a growth-incompatible substrate.

23. An optoelectronic device formed by the method comprising:

implanting ions into a crystal structure to form a damage layer at an implantation depth below a top surface of said crystal structure;

chemically etching said damage layer to effect detachment of a single-crystal film from said crystal structure; and bonding said single-crystal film to a growth-incompatible substrate.

24. An optoelectronic device formed by a method comprising:

implanting ions into a crystal structure to form a damage layer within said crystal structure at an implantation depth below a top surface of said crystal structure;

subjecting said damage layer to a rapid temperature increase to effect detachment of a single-crystal film from said crystal structure; and bonding said single-crystal film to a growth-incompatible substrate.

* * * * *